United States Patent
Cheng

(10) Patent No.: US 10,348,055 B2
(45) Date of Patent: Jul. 9, 2019

(54) FOLDED WAVEGUIDE STRUCTURE SEMICONDUCTOR LASER

(71) Applicant: Futurewei Technologies, Inc., Plano, TX (US)

(72) Inventor: Ning Cheng, Basking Ridge, NJ (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 15/822,961

(22) Filed: Nov. 27, 2017

(65) Prior Publication Data

US 2018/0191133 A1 Jul. 5, 2018

Related U.S. Application Data

(60) Provisional application No. 62/440,985, filed on Dec. 30, 2016.

(51) Int. Cl.
*H01S 5/40* (2006.01)
*H01S 5/10* (2006.01)
(Continued)

(52) U.S. Cl.
CPC ............ *H01S 5/101* (2013.01); *H01S 3/0315* (2013.01); *H01S 3/0675* (2013.01); *H01S 3/076* (2013.01);
(Continued)

(58) Field of Classification Search
CPC ........ H01S 5/026; H01S 5/1003; H01S 5/101; H01S 5/4006
See application file for complete search history.

(56) References Cited

U.S. PATENT DOCUMENTS 5,088,105 A  2/1992 Scifres et al.
5,097,479 A  3/1992 Opower
(Continued)

FOREIGN PATENT DOCUMENTS

CN  105680320  6/2016
JP  64-9679  1/1989
(Continued)

OTHER PUBLICATIONS

"International Application Serial No. PCT CN2017 117539, International Search Report dated Feb. 26, 2018", 5 pgs.
(Continued)

*Primary Examiner* — Michael Carter
(74) *Attorney, Agent, or Firm* — Schwegman Lundberg & Woessner, P.A.

(57) ABSTRACT

A laser apparatus is provided, comprising a semiconductor substrate, an active layer disposed on the semiconductor substrate, a folded waveguide disposed on the active layer and forming a resonant structure, the folded waveguide comprising at least two substantially straight waveguide portions coupled by a connecting waveguide structure, with the folded waveguide having a first end and a second end located at one or more edges of the semiconductor substrate, wherein at least one of the ends includes a mirror, and an electrode coupled to the folded waveguide and configured to create photons in the folded waveguide when receiving electrical power. The waveguide emits laser light comprising the photons, with the laser light emitted at an edge of the semiconductor substrate.

1 Claim, 9 Drawing Sheets

(51) Int. Cl.
*H01S 3/03* (2006.01)
*H01S 3/067* (2006.01)
*H01S 3/07* (2006.01)
*H01S 5/026* (2006.01)
*H01S 5/042* (2006.01)
*H01S 5/12* (2006.01)

(52) U.S. Cl.
CPC ............ *H01S 5/4068* (2013.01); *H01S 5/026* (2013.01); *H01S 5/0425* (2013.01); *H01S 5/1007* (2013.01); *H01S 5/1014* (2013.01); *H01S 5/12* (2013.01); *H01S 5/4006* (2013.01)

(56) References Cited

U.S. PATENT DOCUMENTS 5,901,166 A * 5/1999 Nitta ................. B82Y 20/00
372/27
6,037,189 A * 3/2000 Goto ................. G02B 6/122
117/956
7,627,216 B2   12/2009 Lealman et al.
8,805,134 B1 * 8/2014 Raring ................. H01S 5/026
385/129
9,239,427 B1   1/2016 Raring

FOREIGN PATENT DOCUMENTS

| JP | 2007-142227 | | 6/2007 |
| JP | 2007-251064 | | 9/2007 |
| JP | 2007251064 | * | 9/2007 |

OTHER PUBLICATIONS

"International Application Serial No. PCT CN2017 117539, Written Opinion dated Feb. 26, 2018", 4 pgs.

* cited by examiner

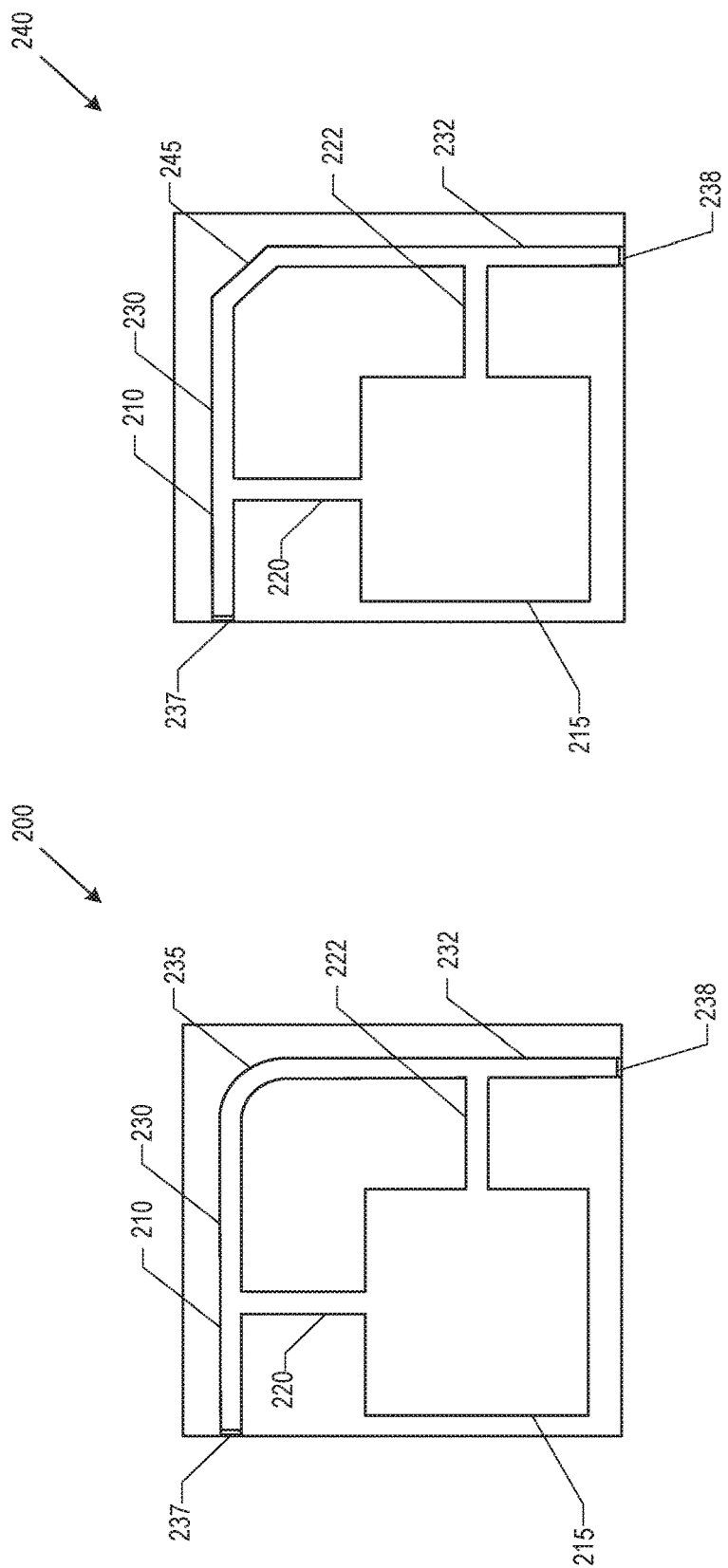

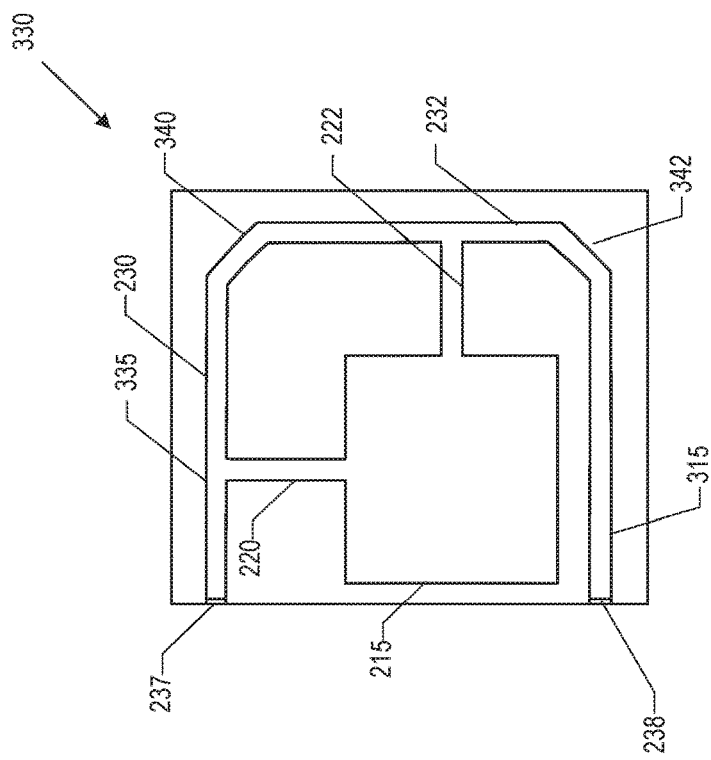
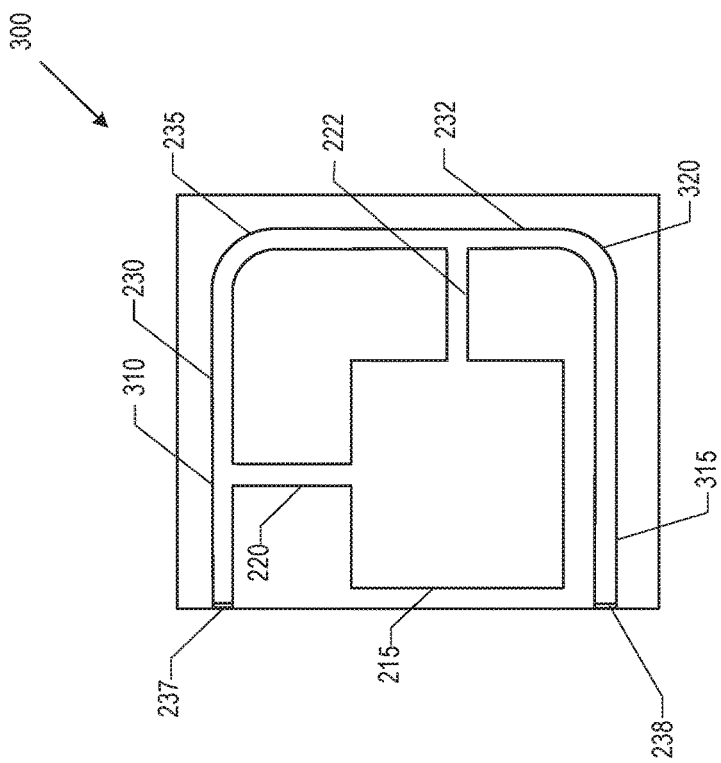

FOLDED WAVEGUIDE STRUCTURE SEMICONDUCTOR LASER

PRIORITY CLAIM

This application claims the benefit of priority to U.S. Provisional Patent Application Ser. No. 62/440,985, filed Dec. 30, 2016, and entitled "FOLDED WAVEGUIDE STRUCTURE SEMICONDUCTOR LASER," which provisional application is incorporated herein by reference in its entirety.

TECHNICAL FIELD

The present disclosure is related to semiconductor lasers. Some aspects of the disclosure relate to semiconductor lasers with folded waveguide structure. Some aspects of the disclosure relate to reducing the chip size of semiconductor lasers using a folded waveguide structure.

BACKGROUND

Semiconductor lasers, as coherent light sources, have found a wide range of applications including optical communications, barcode readers, laser pointers, CD/DVD/Blu-Ray disc reading and recording, laser printing, and laser scanning. Such lasers are fabricated on a semiconductor wafer (e.g. GaAs or InP) with a limited diameter (typically 2-6 inches). With increased wafer size or reduced chip size, each wafer can produce more laser chips, resulting in reduced cost per chip. While the wafer size of a semiconductor laser has been increased from 1 or 2 inches to 4 or 6 inches, the size of the semiconductor laser chip itself has remained the same to meet output power requirements.

A majority of semiconductor lasers used in optical communications are edge emitting lasers, with a resonant structure formed by a straight waveguide between two mirrors (cleaved facets). As the current density in the active region is limited by material property, the total injection current cannot be larger than a certain amount. At the same time, the quantum efficiency of the semiconductor laser is limited, and hence the slope efficiency of the laser is also limited. Therefore, the length of the semiconductor laser waveguide cavity must be larger than a length threshold to meet the output power requirements.

Semiconductor distributed feedback (DFB) lasers are widely deployed in optical network units (ONUs), with passive optical networks having a typical dimension of a few hundred micrometers in length and width. While the length of a semiconductor laser is dictated by its cavity length, its width has to be larger than a certain size to accommodate the bonding pad (typically 100 µm×100 µm), as well as to maintain a desired spacing between the bonding pad and the laser waveguide structure. As wafer growth and processing costs for semiconductor lasers are more or less fixed, the cost of the semiconductor laser is largely determined by the number of chips that can be produced per wafer. Given a fixed wafer size, reducing the size of the semiconductor laser chip can bring significant cost benefit.

SUMMARY

Various examples are now described to introduce a selection of concepts in a simplified form that are further described below in the Detailed Description. The Summary is not intended to identify key or essential features of the claimed subject matter, nor is it intended to be used to limit the scope of the claimed subject matter.

According to one aspect of the present disclosure, a laser apparatus is provided, comprising a semiconductor substrate, an active layer disposed on the semiconductor substrate, a folded waveguide disposed on the active layer and forming a resonant structure, the folded waveguide comprising at least two substantially straight waveguide portions coupled by a connecting waveguide structure, with the folded waveguide having a first end and a second end located at one or more edges of the semiconductor substrate, wherein at least one of the ends includes a mirror, and an electrode coupled to the folded waveguide and configured to create photons in the folded waveguide when receiving electrical power. The waveguide emits laser light comprising the photons, with the laser light emitted at an edge of the semiconductor substrate.

Optionally, in any of the preceding aspects, wherein the connecting waveguide structure comprises a curved waveguide portion coupled between the at least two substantially straight waveguide portions.

Optionally, in any of the preceding aspects, wherein the connecting waveguide structure comprises one or more stepped angular transition sections coupled between the at least two substantially straight waveguide portions, with each stepped angular transition section changing a lightpath angle with respect to a preceding section of the connecting waveguide structure.

Optionally, in any of the preceding aspects, wherein the connecting waveguide structure comprises a total internal reflection bend.

Optionally, in any of the preceding aspects, wherein the folded waveguide comprises at least two connecting waveguide portions coupled between at least three substantially straight waveguide portions to form a substantially serpentine waveguide structure Optionally, in any of the preceding aspects, wherein the folded waveguide comprises a Y-branch waveguide structure having two legs coupled to respective straight waveguide portions of the at least two substantially straight waveguide portions, and shaped to form a stem including a stem mirror that reflects light back toward the legs.

Optionally, in any of the preceding aspects, further comprising an anti-reflection mirror on a first end of the folded waveguide and a high-reflection mirror on a second end of the folded waveguide, wherein the laser light is emitted through the anti-reflection mirror.

Optionally, in any of the preceding aspects, wherein a first end and a second end of the folded waveguide include an etched facet mirror or a cleaved facet mirror.

Optionally, in any of the preceding aspects, wherein the folded waveguide comprises a distributed feedback (DFB) laser.

Optionally, in any of the preceding aspects, wherein the folded waveguide comprises a distributed Bragg reflector (DBR) laser.

Optionally, in any of the preceding aspects, wherein a second portion of the folded waveguide comprises a semiconductor optical amplifier (SOA), and wherein the first portion and the second portion are coupled via a curved waveguide portion.

Optionally, in any of the preceding aspects, wherein the SOA comprises a tapered waveguide portion configured for coupling the folded waveguide to an optical fiber.

Optionally, in any of the preceding aspects, wherein the folded waveguide comprises a first distributed feedback (DFB) laser for generating light via a constant bias current, a second DFB laser with direct modulation, and a connecting waveguide portion that couples a continuous wave light signal from the first DFB laser into the second DFB laser.

Optionally, in any of the preceding aspects, with the semiconductor substrate comprising a semiconductor chip.

Optionally, in any of the preceding aspects, the DBR laser comprises: a DBR section on a first portion of the folded waveguide; a phase section on a second portion of the folded waveguide, the phase section configured to control phase of an output signal via a phase current; and a gain section on a third portion of the folded waveguide, the gain section configured to control gain of the output signal via a gain current.

Optionally, in any of the preceding aspects, the folded waveguide comprises multiple substantially parallel straight waveguide portions with respective multiple distributed feedback (DFB) lasers coupled by 180 degree connecting waveguide structures, wherein one or more of the connecting waveguide structures comprises an etched facet mirror.

According to yet another aspect of the present disclosure, a method for generating an optical signal by a semiconductor laser is provided. The method comprises a folded waveguide generating photons in a substantially straight waveguide portion, with the folded waveguide disposed on an active layer disposed on a semiconductor substrate, with the folded waveguide comprising at least two substantially straight waveguide portions coupled by a connecting waveguide structure, with the folded waveguide having a first end and a second end located at one or more edges of the semiconductor substrate, wherein at least one of the ends includes a mirror, wherein the photons form an optical signal, the folded waveguide transporting the photons through the connecting waveguide portion of the folded waveguide to a second substantially straight waveguide portion to amplify the optical signal within the folded waveguide, and the folded waveguide emitting the optical signal at an edge of the semiconductor substrate.

Optionally, in any of the preceding aspects, the folded waveguide comprises a distributed feedback (DFB) laser.

Optionally, in any of the preceding aspects, the folded waveguide comprises a distributed Bragg reflector (DBR) laser.

Optionally, in any of the preceding aspects, a second portion of the folded waveguide comprises a semi-conductor optical amplifier (SOA), and wherein the first portion and the second portion are coupled via a curved waveguide portion.

Optionally, in any of the preceding aspects, the SOA comprises a tapered waveguide portion configured for coupling the folded waveguide to an optical fiber.

Optionally, in any of the preceding aspects, the folded waveguide comprises a first distributed feedback (DFB) laser for generating light via a constant bias current, a second DFB laser with direct modulation, and a connecting waveguide portion that couples a continuous wave light signal from the first DFB laser into the second DFB laser.

Any one of the foregoing examples may be combined with any one or more of the other foregoing examples to create a new embodiment within the scope of the present disclosure.

BRIEF DESCRIPTION OF THE DRAWINGS

In the figures, which are not necessarily drawn to scale, like numerals may describe similar components in different views. Like numerals having different letter suffixes may represent different instances of similar components. The figures illustrate generally, by way of example, but not by way of limitation, various embodiments discussed in the present document.

FIG. 2A is a top view of a folded cavity semiconductor laser with an about 90° bend using curved waveguide bends, according to some example embodiments.

FIG. 2B is a top view of a folded semiconductor laser with an about 90° bend using total internal reflection bends, according to some example embodiments.

FIG. 3A is a top view of a folded semiconductor laser with a U-shaped waveguide, according to some example embodiments.

FIG. 3B is a top view of a folded semiconductor laser having a U-shaped waveguide with straight waveguide portions coupled by total internal reflection bends, according to some example embodiments.

DETAILED DESCRIPTION

Figure 1A:
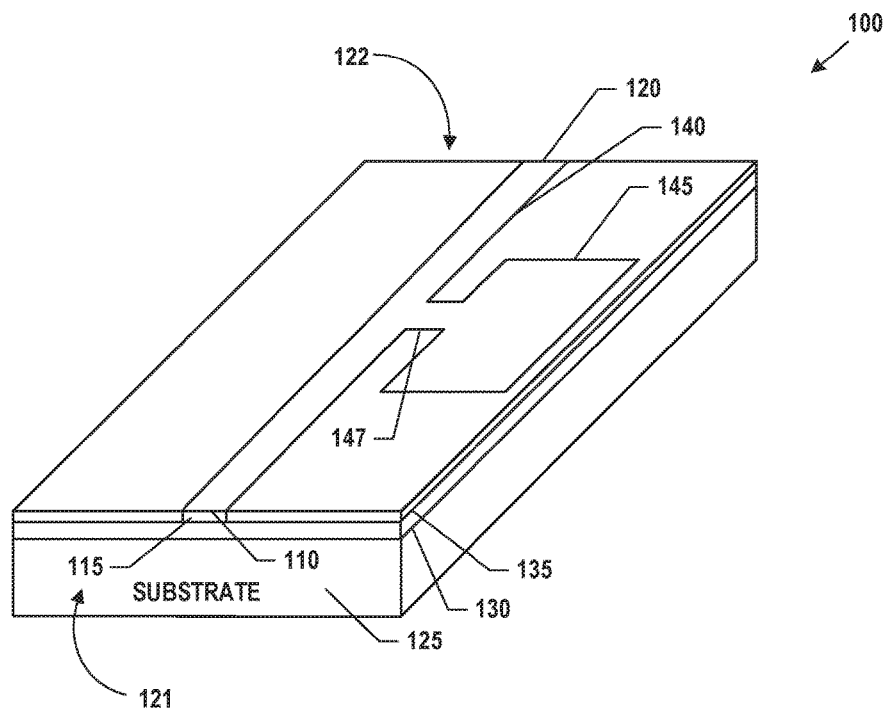
FIG. 1A is a perspective diagram illustrating an edge emitter semiconductor laser with a straight ridge waveguide.

In the following description, reference is made to the accompanying drawings that form a part hereof, and in which are shown, by way of illustration, specific embodiments which may be practiced. These embodiments are described in sufficient detail to enable those skilled in the art to practice the inventive subject matter, and it is to be understood that other embodiments may be utilized and that structural, logical, and electrical changes may be made without departing from the scope of the present disclosure. The following description of example embodiments is, therefore, not to be taken in a limiting sense, and the scope of the present disclosure is defined by the appended claims.

The functions or algorithms described herein may be implemented in software, in one embodiment. The software may consist of computer-executable instructions stored on computer-readable media or a computer-readable storage device such as one or more non-transitory memories or other types of hardware-based storage devices, either local or networked. The software may be executed on a digital signal processor, application-specific integrated circuit (ASIC), programmable data plane chip, field-programmable gate array (FPGA), microprocessor, or other type of processor operating on a computer system, such as a switch, server, or other computer system, turning such a computer system into a specifically programmed machine.

Aspects described herein can be used to alleviate the chip size restriction associated with semiconductor lasers resulting from output power considerations (e.g., length of the waveguide has to be larger than a certain threshold length to meet a minimum output power level) and bonding pad considerations (e.g., semiconductor laser substrate width has to accommodate a bonding pad). More specifically, the size of semiconductor lasers may be reduced using folded waveguide structures and flip-chip bonding techniques. The folded waveguide structure can reduce the length of the semiconductor laser chip, while a flip-chip bonding process can be used in connection with removal of the bonding pad on the top of the semiconductor laser chip and, thereby, reducing the width of the semiconductor laser chip.

With smaller chip size, more semiconductor lasers may be produced on a single chip, reducing the cost of semiconductor laser chips. Alternatively, the chip size could remain the same, while the output power of the laser could be improved (e.g., based on a longer waveguide design for a given fixed chip size). In some aspects, a difference between proposed solutions disclosed herein and conventional semiconductor lasers can include the folded waveguide structure and the flip-chip bonding process (resulting in bonding pad removal) for laser packaging. Furthermore, in instances when a semiconductor laser is flip-chip bonded and a bonded pad is removed, other useful functions can be integrated on the chip (such as spot size converter and semiconductor optical amplifier) without increasing the chip size.

Figure 1B:
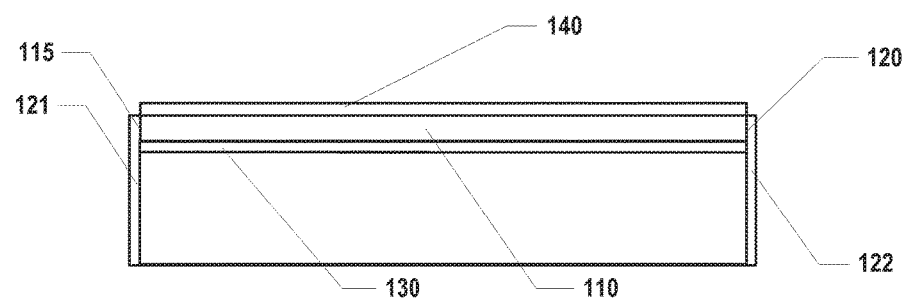
FIG. 1B is a side view of the waveguide of FIG. 1A.

FIG. 1A is a perspective diagram illustrating an edge emitter semiconductor laser 100 with a straight ridge waveguide. FIG. 1A depicts a semiconductor laser 100, a substrate 125, a waveguide 110, an active layer 130, a waveguide layer 135, cleaved facets 115 and 120, an electrode 140, a bonding pad 145, and a conductor 147. FIG. 1B depicts the waveguide 110, the electrode 140, the cleaved facets 115 and 120, and mirrors 121 and 122 on the ends of the substrate 125. FIG. 1B is a side view of the waveguide 110 of FIG. 1A. It should be understood that the mirrors 121 and 122 are not necessarily drawn to scale and in some embodiments may comprise reflective coatings or films positioned over the ends of the waveguide 110. Referring to FIG. 1A, semiconductor laser 100 can be disposed on the substrate 125 supporting the active layer 130, which further supports the waveguide layer 135. As used herein in connection with semiconductor layers, the term "disposed on" indicates a layer supporting another layer with or without one or more intervening layers.

The edge emitter semiconductor laser 100 is a type of semiconductor laser, where the laser light propagates in a direction along a surface of the substrate 125 and is reflected or coupled out (i.e., transmitted or emitted) at a cleaved facet (e.g., 115 and 120) of a waveguide (e.g., 110), where the facet can be coated or uncoated. In some aspects, light signal can be generated by applying a drive current to the p-electrode (e.g., the contact layer in contact with the bonding pad 145). In some aspects, the waveguide 110 can be a straight ridge waveguide, which can include a light-conducting channel structure at a top surface of the substrate (e.g., as seen in FIG. 1A).

As used herein, the term "waveguide" means a structure that guides waves, such as electromagnetic waves, with minimal loss of energy by confining the wave in one or two dimensions. A ridge waveguide is a type of a waveguide, where waves are guided in a ridge-like structure (e.g., on top of a substrate). Straight ridge waveguide indicates that the waveguide is straight, without any bends along the length of the waveguide.

The waveguide 110 can be formed as part of the waveguide layer 135. In some aspects, semiconductor lasers, such as laser 100, can be used in optical communications as edge emitting lasers, with optical resonant structures formed by the waveguide 110 between the cleaved facets 115 and 120 at the ends of the substrate 125. In some aspects, the facets 115 and 120 can include anti-reflection coatings, high-reflection coatings, or the mirrors 121 and 122 (as shown in FIG. 1B), and can be disposed at or about the edge of the substrate 125 for off-chip laser light emission. An optical waveguide is a structure that guides light waves and enables a signal to propagate with minimal loss of energy by restricting expansion to one or two dimensions. Waveguide 110 is an optical waveguide in one embodiment and may be rectangular in cross-sectional shape. In various embodiments, waveguide 110 may be a slab, planar, strip, or rib waveguide, or other structure suitable for forming an optical resonant structure for a laser.

The electrode 140 can be formed on the waveguide layer 135, and can be configured to cause photons to be generated in the waveguide 110 when connected to a driving current. Electrode 140 may be a thin layer of a conductor (or semiconductor) material, such as metal or other conductive material. The bonding pad 145 can be electrically coupled to the electrode 140 via the conductor 147, and can be spaced from the waveguide 110 at a sufficient distance for wire bonding.

The length of conductor 147 and the bonding pad size are aspects of the design of a semiconductor layer that contribute to the area of a substrate. In accordance with some aspects described herein below, a semiconductor laser can include a folded waveguide (e.g. waveguide with one or more turns) in order to reduce the area of the substrate and the semiconductor laser size. Additionally, flip chip bonding can be used in order to eliminate the bonding pad and further reduce the semiconductor laser size.

FIG. 2A is a top view representation of a folded semiconductor laser 200 with an approximately 90° bend using a curved waveguide employing a bend or bends formed in the waveguide material, according to some example embodiments. The folded waveguide can also be referred to as a folded cavity waveguide. As used herein, the term "cavity" refers to the internal space of a waveguide in which the light oscillates, and comprises an at least partially light-transmissive material. FIG. 2A depicts the laser 200, which includes a folded waveguide 210 (including portions 230, 232, and 235), bonding pad 215, conductors 220 and 222, and mirrors 237 and 238. In some aspects, the mirrors can be facet mirrors or another type of mirrors.

In an embodiment, the semiconductor laser 200 comprises a semiconductor substrate 125, an active layer 130 disposed on the semiconductor substrate 125, and the folded waveguide 210 disposed on the active layer 130 and forming a resonant structure. The folded waveguide 210 comprises at least two substantially straight waveguide portions 230 and 232 coupled by a connecting waveguide structure 235. The folded waveguide 210 has a first end and a second end located at one or more edges of the semiconductor substrate 125, wherein at least one of the ends includes a mirror 237 or 238. The laser apparatus 200 further comprises an electrode 210 coupled to the folded waveguide 210 and configured to create photons in the folded waveguide 210 when receiving electrical power. The folded waveguide 210 emits laser light comprising the photons, with the laser light emitted at an edge of the semiconductor substrate 125.

In an embodiment, the connecting waveguide structure 235 comprises a total internal reflection bend. In an embodiment, the connecting waveguide structure 235 comprises a curved waveguide portion 235 coupled between the at least two substantially straight waveguide portions 230 and 232. In an embodiment, the connecting waveguide structure comprises one or more stepped angular transition sections 340 coupled between the at least two substantially straight waveguide portions 230 and 232, with each stepped angular transition section changing a lightpath angle with respect to a preceding section of the connecting waveguide structure (see FIGS. 2B, 3B, and 4B).

The waveguide 210 may be covered by an electrode, also represented at 210, since both trace the same path, with the waveguide 210 being beneath the electrode and not separately visible in a top view. The bonding pad 215 may be electrically coupled to the waveguide 210 by one or more conductors 220-222. In one embodiment, the bonding pad 215 is rectangular, such as a square, and the curved waveguide has two substantially orthogonal, substantially straight portions 230 and 232 coupled by a waveguide connecting structure shown as an about 90° curved bend 235. The curved bend 235 is provided to efficiently transfer light between the orthogonal portions 230 and 232 with minimal loss, creating a longer resonant cavity.

In one embodiment, the electrode can be deposited on the top of a chip cut from a semiconductor substrate having multiple lasers formed thereon, and may cover the entire waveguide area. Electrical current may be injected through the electrode to generate photons associated with a light signal in the waveguide 210. In one embodiment, the bonding pad 215, the electrode covering the whole waveguide area 210, and the metal connecting the bonding pad 215 and the electrode (e.g., conductors 220 and 222) may be deposited as one single piece of conductor.

Each of the embodiments described herein may have etched (or cleaved) facet mirrors on ends of the waveguide at or about the boundaries of the chip, such as shown at 237 and 238 in FIGS. 2A-4C. In some aspects, the mirror 237 in FIG. 2A can be highly reflective mirror (e.g., to achieve mirror reflectivity close to 1, by reflecting the light signal back into the folded waveguide 210 to form a resonator and avoid signal loss), and mirror 238 can be an anti-reflection mirror (i.e., to achieve mirror reflectivity close to 0, when the light signal is not reflected back within the folded waveguide 210 and is output at the anti-reflection coated end of the folded waveguide 210).

In an embodiment, the folded waveguide further comprises an anti-reflection mirror on a first end of the folded waveguide and a high-reflection mirror on a second end of the folded waveguide, wherein the laser light is emitted through the anti-reflection mirror. In an embodiment, a first end and a second end of the folded waveguide include an etched facet mirror or a cleaved facet mirror.

As used herein, the term "facet mirror" or "mirror" refers to a highly reflective surface or facet of an end surface of a semiconductor structure, such as an end of a wafer or a wafer portion. In some aspects, cleaved-facet technology (CFT) can be used to obtain a cleaved facet mirror. CFT is a mechanical process where laser surfaces are mechanically cut to form the facet mirror (e.g., a semiconductor wafer is mechanically cut in individual strips for use in laser manufacturing, where the mechanically cut surface of the wafer strips are the "cleaved facet mirrors"). In some aspects, etched-facet technology (EFT) can be used to obtain an etched facet mirror. EFT is a chemical process, where a chemical etching agent is applied to a semiconductor wafer at precise locations, so that the chemical agent performs the cutting of the wafer into individual strips. The facets formed during such EFT process can be referred to as etched facet mirrors.

In some aspects, mirrors (cleaved or etched facet mirrors or other types of mirrors) can include a reflection coating or layer for reflection control (e.g., highly reflective coating or anti-reflection coating, as mentioned herein above).

Even though the present specification refers to a facet mirror as etched or cleaved, the disclosure is not limited in this regard and both types of facet mirrors can be interchangeably used in connection with techniques and devices described herein. Additionally, the terms "facet mirror" and "mirror" are used interchangeably herein.

In some aspects and in reference to FIG. 2A, mirror 237 can include a high-reflection (HR) coating, and mirror 238 can include an anti-reflection (AR) coating. In this case, the light signal generated by laser 200 can be output at the end of the folded waveguide 210, through the anti-reflection coated mirror 238. In other aspects and in reference to FIGS. 2A-4C, mirrors 237 and 238 can be coated to achieve different levels of reflectivity and achieve directionality of the light output (e.g., one of the mirrors can be coated with highly reflective coating, while the other mirror can be coated with an anti-reflection coating to function as the light signal output).

In some aspects, the portions 230 and 232 are substantially straight to minimize light loss, and may be a result of semiconductor manufacturing processes. The portions 230 and 232, and other substantially straight portions described herein, need not be perfectly straight and may vary from straight based on manufacturing process anomalies, or by design to allow some loss. In some embodiments, the portions are made as straight as possible to optimize laser power.

For a certain cavity length to meet a desired output power requirement, the chip length and/or width can be reduced significantly using various folded cavity designs of the waveguide, as described herein. Alternatively, if the chip size remains the same, the cavity length of the semiconductor laser waveguide may be increased, which increases output power, which may necessitate an increase in the injection current. However, the bonding pad on top of the semiconductor laser chip can still occupy significant area and further improvements can be made by removing the bonding pad (e.g., as illustrated in reference to FIGS. 4A-8, where flip chip bonding can be used).

In one embodiment, the folded waveguide comprises a distributed feedback (DFB) laser. In another embodiment, the folded waveguide comprises a distributed Bragg reflector (DBR) laser. In yet another embodiment, a second portion of the folded waveguide comprises a semi-conductor optical amplifier (SOA), and wherein the first portion and the second portion are coupled via a curved waveguide portion. In yet another embodiment, a second portion of the folded waveguide comprises a semi-conductor optical amplifier (SOA), and wherein the first portion and the second portion are coupled via a curved waveguide portion, wherein the SOA comprises a tapered waveguide portion configured for coupling the folded waveguide to an optical fiber. In yet another embodiment, the folded waveguide comprises a first distributed feedback (DFB) laser for generating light via a constant bias current, a second DFB laser with direct modulation, and a connecting waveguide portion that couples a continuous wave light signal from the first DFB laser into the second DFB laser.

FIG. 2B is a top view of a folded semiconductor laser 240 with an about 90° bend using total internal reflection bends or changes in direction, according to some example embodiments. In the figure, the connecting waveguide structure 245 comprises one or more stepped angular transition sections coupled between the at least two substantially straight waveguide portions 230 and 232, with each stepped angular transition section changing a lightpath angle with respect to a preceding section of the connecting waveguide structure. In some embodiments, the bends or changes in direction 245 do not exceed a predetermined curve radius or bend angle. The predetermined curve radius or bend angle may depend on an index of refraction of the waveguide material, for example, so that a total internal reflection bend is achieved through the entire waveguide 210. FIG. 2B depicts the laser 240, which includes waveguide 210 (including portions 230, 232, and 245), bonding pad 215, conductors 220 and 222, and mirrors 237 and 238. The orthogonal portions 230 and 232 of the waveguide 210 are coupled via a total internal reflection bend 245.

Total internal reflection refers to the reflection of the total amount of incident light at the boundary region between two different media. In instances when a wave (e.g., a light signal) reaches a boundary region between two different media with different refractive indices, the wave traveling in a first medium will be partially refracted at the boundary with the second medium (i.e., it will change direction of propagation due to change in transmission media) and partially reflected. However, in instances when the angle of incidence of the wave signal is greater than the critical angle (namely, the angle of incidence when the refracted wave is communicated along the boundary surface), then the wave is reflected back in totality within the first medium, without crossing the boundary with the second medium (i.e., a total internal reflection is achieved).

As used herein, the term "total internal reflection bend" indicates a waveguide which includes one or more bends or changes in direction in the waveguide, but still maintaining total internal reflection of the light signal within the entire length of the waveguide (i.e., no signal is lost or dissipates within any straight or curved portions of the waveguide). In this regard, any portion of a waveguide (such as a smooth curved portion 235 or stepped angular transition sections such as the waveguide portion including bends 245) disclosed herein as including a total reflection bend can be configured (e.g., at time of design or manufacture) so that the angle of incidence of the wave signal is greater than the critical angle in order to achieve total reflection.

FIG. 3A is a top view of a folded semiconductor laser 300 with a U-shaped waveguide 310, which can further reduce the chip size compared to conventional semiconductor lasers with straight waveguide. FIG. 3A depicts the laser 300, which includes waveguide 310 (including portions 230, 232, 315, 235, and 320), bonding pad 215, conductors 220 and 222, and mirrors 237 and 238. The waveguide 310 has curved portion 235 between portions 230 and 232, as well as a bonding pad 215 with connectors 220 and 222, and the electrode covering the waveguide 310. In addition, a third waveguide portion 315, which is orthogonal to portion 232, is coupled via a second curved portion 320 to portion 232. The portions 230, 232 and 315, together with curved waveguide portions 235 and 320, form the U-shaped waveguide 310 around the bonding pad 215.

Even though FIG. 3A illustrates the bonding pad 215 connected to the waveguide 310 via connectors 220 and 222, the disclosure is not limited in this regard and additional connectors between the waveguide 310 and the bonding pad 215 can be used to reduce resistance when supply current is applied.

In some aspects, a waveguide bend can increase signal loss and can result in higher thresholds and lower slope efficiency. Even though such side effects can be less desirable for many applications, they may be acceptable for ONUs, where manufacturing cost can be of paramount importance.

FIG. 3B is a top view of a folded semiconductor laser 330 having a U-shaped waveguide 335 with straight waveguide portions coupled by total internal reflection bends, according to some example embodiments. FIG. 3B depicts the laser 330, which includes waveguide 335 (including portions 230, 232, 315, 340, and 342), bonding pad 215, conductors 220 and 222, and mirrors 237 and 238. Waveguide portions 230 and 232 can be coupled by a total internal reflection bend 340, and waveguide portions 232 and 315 can be coupled by a total internal reflection bend 342.

In some aspects, to further reduce the chip size or increase the cavity length (hence the output power) of the semiconductor laser, the bonding pad 215 may be removed. Flip-chip bonding may be used to mount the semiconductor laser on a sub-mount with electrical contacts, while the substrate of the semiconductor laser is wired bonded to an external driving circuit supplying the driving current. With the bonding pad removed, the semiconductor laser waveguide cavity with electrode can be folded multiple times to further reduce the chip size, as shown in FIG. 4A.

Figure 4B:
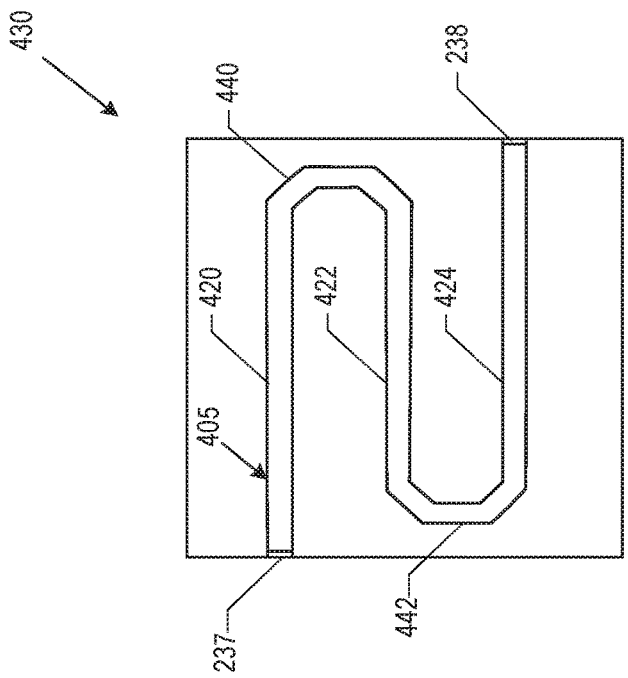
FIG. 4B is a top view of a folded semiconductor laser with straight waveguide portions connected by compound total internal reflection bends, according to some example embodiments.
Figure 4A:
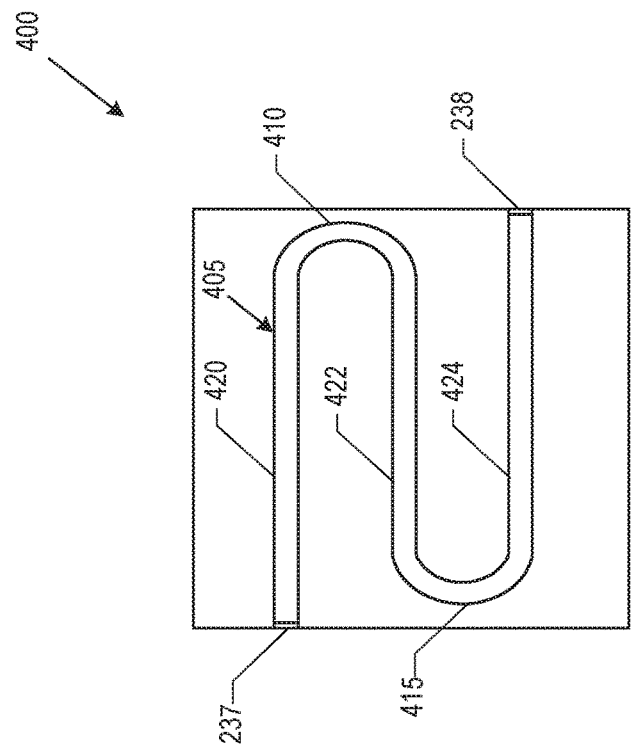
FIG. 4A is a top view of a folded semiconductor laser with curved waveguide connecting structures connecting straight waveguide portions, according to some example embodiments.

FIG. 4A is a top view of a folded semiconductor laser 400 with curved waveguide connecting structures connecting straight waveguide portions, according to some example embodiments. The straight waveguide portions run substantially parallel to each other in the embodiment shown. Referring to FIG. 4A, the waveguide 405 can include curved waveguide connecting structures or portions 410 and 415 connecting straight waveguide portions 420, 422, and 424. Waveguide portions 420, 422, and 424 can run substantially parallel to each other. In the embodiments of FIGS. 4A-4B, the folded waveguide 405 comprises at least two connecting waveguide portions 410 and 415 coupled between at least three substantially straight waveguide portions 420, 422, and 424 to form a substantially serpentine waveguide structure 405.

FIG. 4B is a top view of a folded semiconductor laser 430 with straight waveguide portions connected by compound total internal reflection bends, according to some example embodiments. Referring to FIG. 4B, the straight waveguide portions 420, 422, and 424 of waveguide 405 can be connected by total internal reflection bend waveguide portions 440 and 442, which provide 180° reflecting structures. The total internal reflection bend waveguide portions 440 and 442 also provide a lateral offset to efficiently couple the straight waveguide portions that are separated from each other by the same lateral offset.

Figures 4C, 4D:
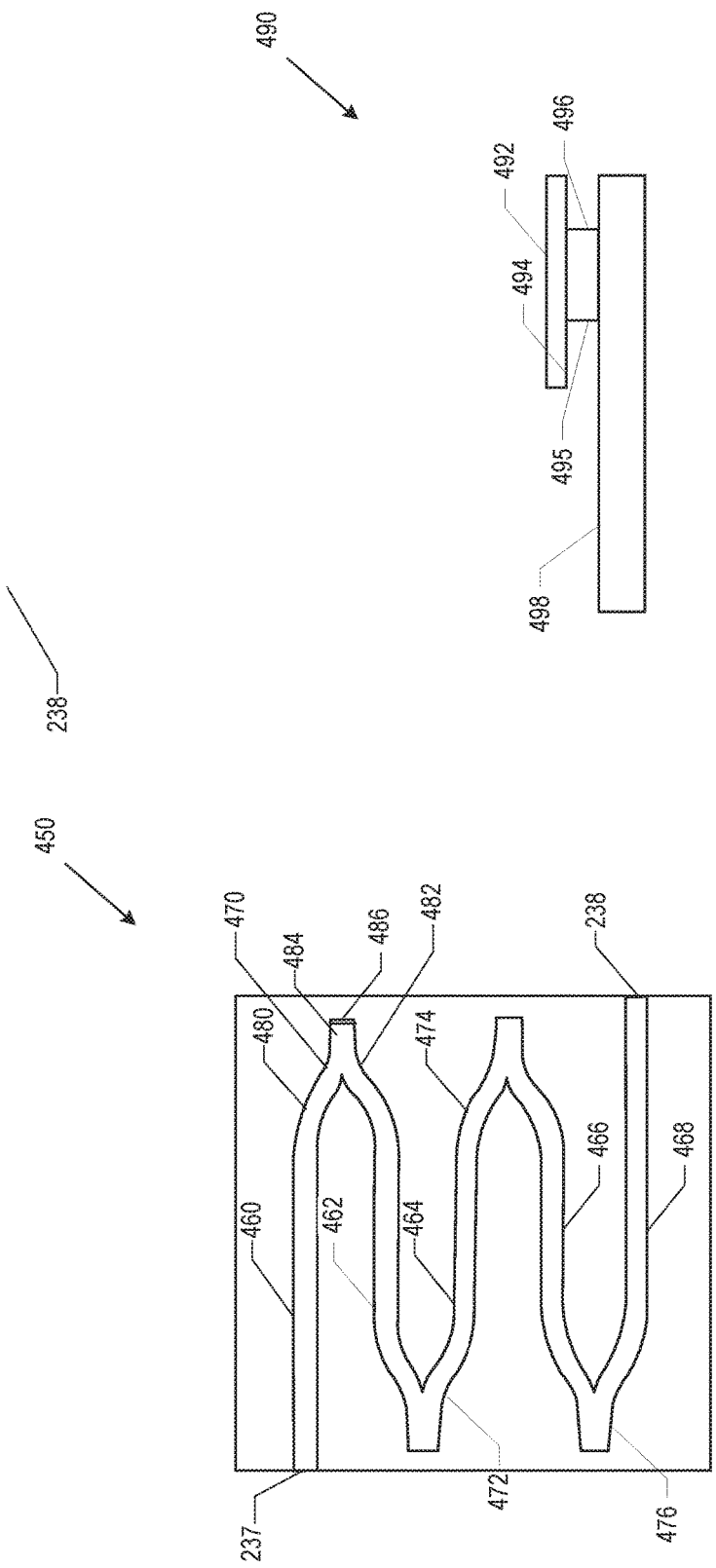
FIG. 4C is a top view of a folded waveguide having straight waveguide portions coupled by Y-branch waveguide connecting structures, according to some example embodiments.
FIG. 4D is a side view of a semiconductor laser having a substrate supporting a folded waveguide that has been flipped and bonded via one or more connectors to an external driving circuit, according to some example embodiments.

FIG. 4C is a top view of a folded waveguide 450 having straight waveguide portions coupled by Y-branch waveguide connecting structures, according to some example embodiments. More specifically, waveguide 450 can include five straight waveguide portions 460, 462, 464, 466, and 468, coupled by four Y-branch (or wishbone-shaped) waveguide connecting structures 470, 472, 474, and 476 that provide efficient reflection and lateral offset matching the distance between the substantially parallel straight portions. In the embodiment of FIG. 4C (and FIG. 8), the folded waveguide 450 comprises a Y-branch waveguide structure having two legs coupled to respective straight waveguide portions of the at least two substantially straight waveguide portions 460, 462, 464, 466, and 468, and shaped to form a stem 484 including a stem mirror 486 that reflects light back toward the legs.

The Y-branch waveguide connecting structures 470, 472, 474, and 476 each couple ends of adjacent straight waveguide portions via a respective leg, such as indicated at 480 and 482 (with legs 480 and 482 being part of the Y-branch waveguide structure 470; only legs 480 and 482 are indicated in FIG. 4C for simplicity). Each leg of a Y-branch waveguide structure can include a double curved connecting waveguide structure that curves toward a straight waveguide portion and then curves oppositely to meet with the other leg, forming a stem (e.g., 484) of the Y-branch waveguide structure. In some aspects, an end of each stem can include a stem mirror (e.g., as indicated at 486) to reflect light back towards a next straight waveguide portion. Even though FIG. 4C illustrates only a single stem mirror 486, the disclosure is not limited in this regard, and stems of Y-branch structures 472, 474, and 476 can also include such stem mirrors.

FIG. 4D is a side view of a semiconductor laser 490 having a substrate supporting a folded waveguide that has been flipped and bonded via one or more connectors 496 to an external driving circuit 498. In some aspects, the folded waveguide can be the same as waveguide 450 of FIG. 4C. Alternatively, any of the embodiments herein can be employed in the semiconductor laser 490.

As illustrated in FIGS. 2A-4C, semiconductor lasers can use folded waveguides, which results in reducing the length of the semiconductor lasers while maintaining a certain output power. In instances when the chip size remains the same, using a folded cavity waveguide design can result in an increase of the output power of the semiconductor laser. In some aspects, a small bending radius in the waveguide may help in size reduction, but a tight bend could result in excessive loss. Hence, there exists a design trade-off between size and performance. In aspects where flip-chip bonding is used, no bonding pad is necessary on the top side of semiconductor laser chip, allowing a folded cavity waveguide to be fabricated with a fixed chip width. In addition, under a certain injection current, the folded cavity semiconductor laser may have a larger current density per unit area. Flip-chip bonding may also lead to a better thermal dissipation for the semiconductor laser chip as the active layer of the semiconductor laser is closer to the sub-mount (circuit 498) which may also function as a heat sink.

Figure 5:
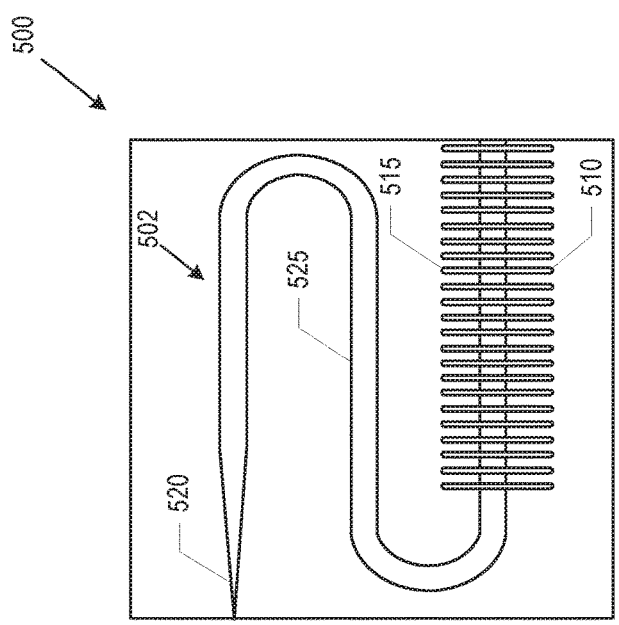
FIG. 5 is a top view of a semiconductor laser that includes a distributed feedback (DFB) laser having a diffraction grating along with a spot size converter in the form of a tapered waveguide, according to some example embodiments.

FIG. 5 is a top view of a semiconductor laser 500 that includes a distributed feedback (DFB) laser having a diffraction grating 515 along with a spot size converter 520 in the form of a tapered waveguide, according to some example embodiments. Referring to FIG. 5, the semiconductor laser 500 can include a folded waveguide 502. In some aspects, the waveguide 502 can include a distributed feedback (DFB) laser 510 having a diffraction grating 515, along with a spot size converter in the form of a tapered waveguide 520. The DFB laser 510 can be used to achieve better signal spectrum and reduced signal dispersion. In some aspects, the tapered waveguide 520 may also be covered by an electrode to reduce loss (since the taper can be an active taper). The tapered waveguide 520 may provide for more efficient optical coupling to an optical fiber by reducing the cross section of a folded waveguide based resonant structure to be more compatible with the cross section of the optical fiber or other optical elements, and to reduce coupling signal losses. In this regard, the tapered waveguide 520 can be used as an output section of a folded waveguide laser.

In one embodiment, the folded waveguide 502 includes the DFB laser 510, the tapered waveguide 520, and a semiconductor optical amplifier (SOA) 525, which is a substantially straight waveguide portion that amplifies incident light through stimulated emission. In some embodiments, the second portion 525 of the folded waveguide 502 comprises a semi-conductor optical amplifier (SOA) 525, and wherein the first portion and the second portion are coupled via a curved waveguide portion, and wherein the SOA 525 comprises a tapered waveguide portion 520 configured for coupling the folded waveguide to an optical fiber. As seen in FIG. 5, the folded waveguide 502 includes multiple straight portions coupled via curved connecting structures, and can also include other optical connecting structures as previous described (e.g., total internal reflection bends or Y-branch waveguide connecting structures). Such a folded cavity laser may achieve the same or higher output power without increasing the chip size, while at the same time the coupling efficiency between the laser and optical fiber can be improved through the spot size converter (e.g., the tapered waveguide 520).

Figure 6:
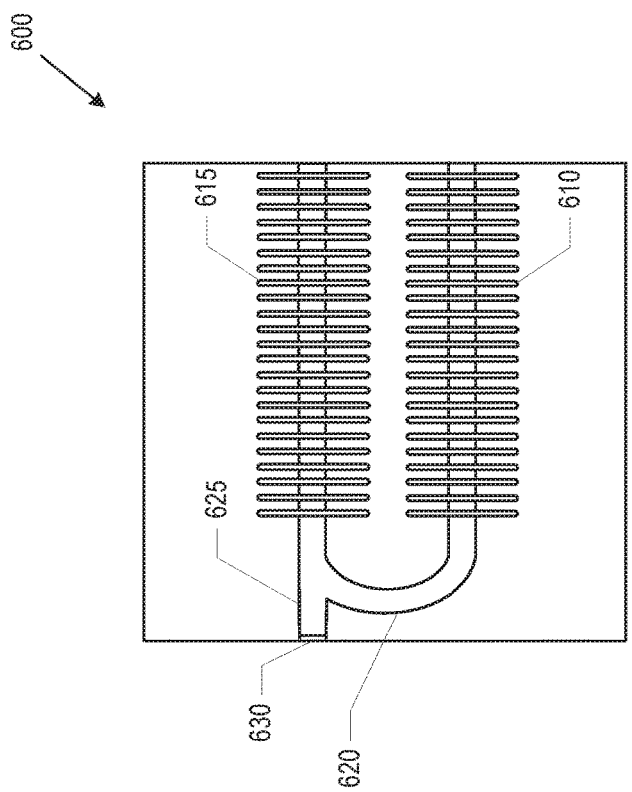
FIG. 6 is a top view of a coupled cavity laser with injection locking, according to some example embodiments.

FIG. 6 is a top view of a coupled cavity laser 600 with injection locking, according to some example embodiments. Referring to FIG. 6, laser 600 can be a coupled cavity laser including a plurality of DFB lasers 610 and 615. More specifically, laser 600 can include a first DFB laser (DFB1) 610, which can be a laser that is biased with a constant current. Continuous wave (CW) light from DFB1 610 can be injected into a second DFB laser (DFB2) 615 via a curved waveguide portion 620. In some aspects, DFB2 615 can be a DFB laser with direct modulation. In some aspects, DFB1 610 can be referred to as a Master laser, and DFB2 615 can be referred to as a Slave laser.

Resulting light signals can be output via a waveguide 625, which may include a mirror 630 at an edge of a semiconductor substrate. In instances when the light signals are output by the mirror 630, such mirror can be coated with an anti-reflection coating. The second laser 615 may alternatively be a Fabry-Perot (FP) laser. In some aspects, injection locking of the CW light from DFB1 610 can be used to increase the modulation bandwidth, reduce frequency chirp, and improve reflection tolerance of DFB2 615. With better reflection tolerance, such a coupled cavity laser can be used without an optical isolator.

Figure 7B:
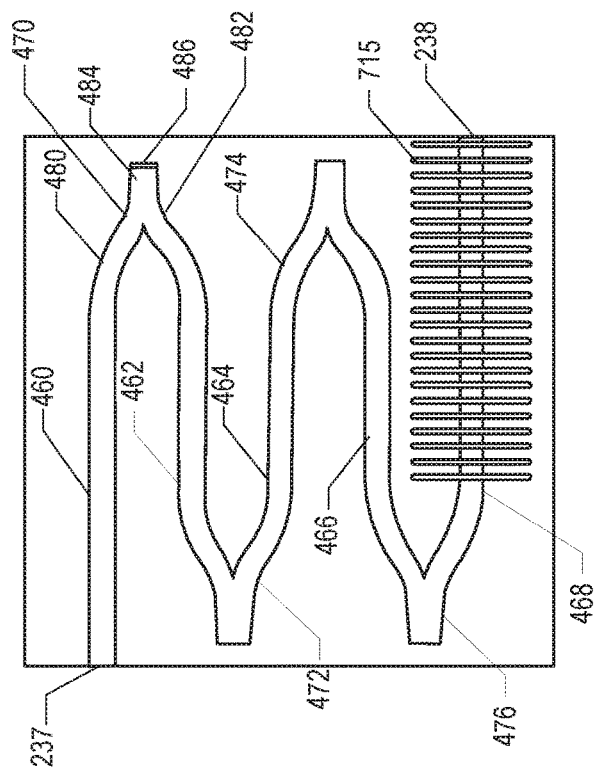
FIG. 7B is a top view of a multi-wavelength DBR laser having a folded waveguide including straight waveguide portions coupled by Y-branch waveguide connecting structures, according to some example embodiments.
Figure 7A:
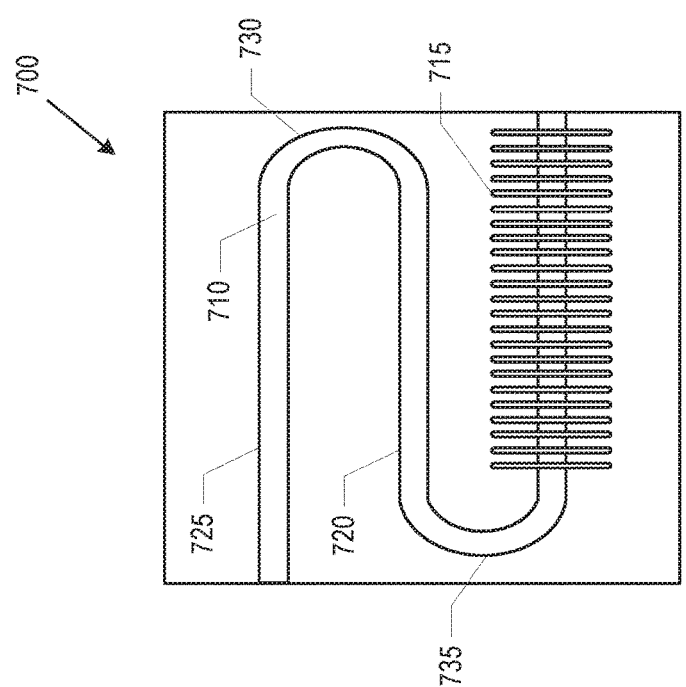
FIG. 7A is a top view of a semiconductor distributed Bragg reflector (DBR) multi-section laser, according to some example embodiments.

FIG. 7A is a top view of a semiconductor distributed Bragg reflector (DBR) multi-section laser 700, according to some example embodiments. Referring to FIG. 7A, the multi-section DBR laser 700 can include a folded waveguide 710 with multiple sections. More specifically, the folded waveguide 710 can include a DBR section 715, a phase section 720, and a gain section 725. The DBR section 715, the phase section 720, and the gain section 725 of the folded waveguide 710 can be configured to run substantially parallel to each other. Additionally, the DBR section 715, the phase section 720, and the gain section 725 can be coupled via connecting waveguide portions 730 and 735 (e.g., curved waveguide sections as illustrated or total reflection bend sections). Such a folded cavity DBR laser can achieve the same output power with reduced chip size and cost. In some aspects, the DBR section 715 can be used at a portion of the folded waveguide where the light signals are generated, and the gain section 725 can used at a portion of the folded waveguide where the light signals are output.

FIG. 7B is a top view of a multi-wavelength DBR laser having a folded waveguide including straight waveguide portions coupled by Y-branch waveguide connecting structures of the type shown in FIG. 4C, according to some example embodiments.

Figure 8:
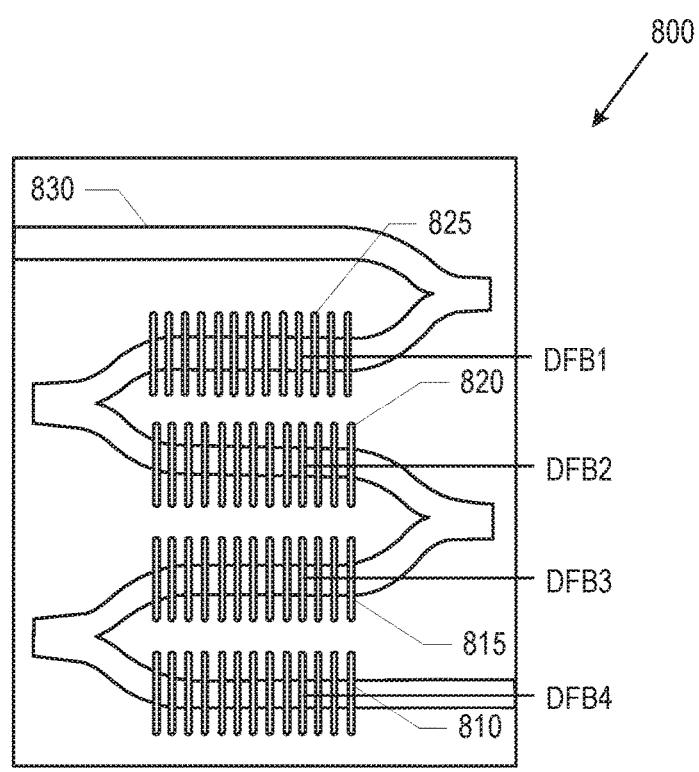
FIG. 8 is a top view of a multi-wavelength DFB laser, according to some example embodiments.

FIG. 8 is a top view of a multi-wavelength DFB laser 800, according to some example embodiments. Referring to FIG. 8, the multi-wavelength DFB laser 800 can include cascaded DFB lasers DFB1-DFB4. In cascaded DFB laser 800, the multiple straight waveguide sections have corresponding diffraction gratings 810, 815, 820, and 825 with different periods so that each section of the cascaded DFB laser 800 corresponding to DFB1-DFB4 produces a light signal with a different wavelength. In some aspects, one of the waveguide sections (e.g., 830) can be configured as a semiconductor optical amplifier (SOA). The waveguide sections for the DFB lasers DFB1-DFB4 can be coupled by connecting structures, such as Y-branch waveguide connectors (as illustrated in FIG. 8), curved sections, total internal reflectors, or other means of propagating light through folded or substantially straight waveguide portions in various embodiments, including serpentine-shaped waveguide portions in some embodiments.

In some embodiments, the waveguide cavity of a semiconductor laser can be folded in a plane that is parallel to the substrate. Alternatively, the waveguide cavity can be folded in a direction perpendicular to the substrate. Such an implementation could be more difficult but could result in further reduction of the chip size.

Figure 9:
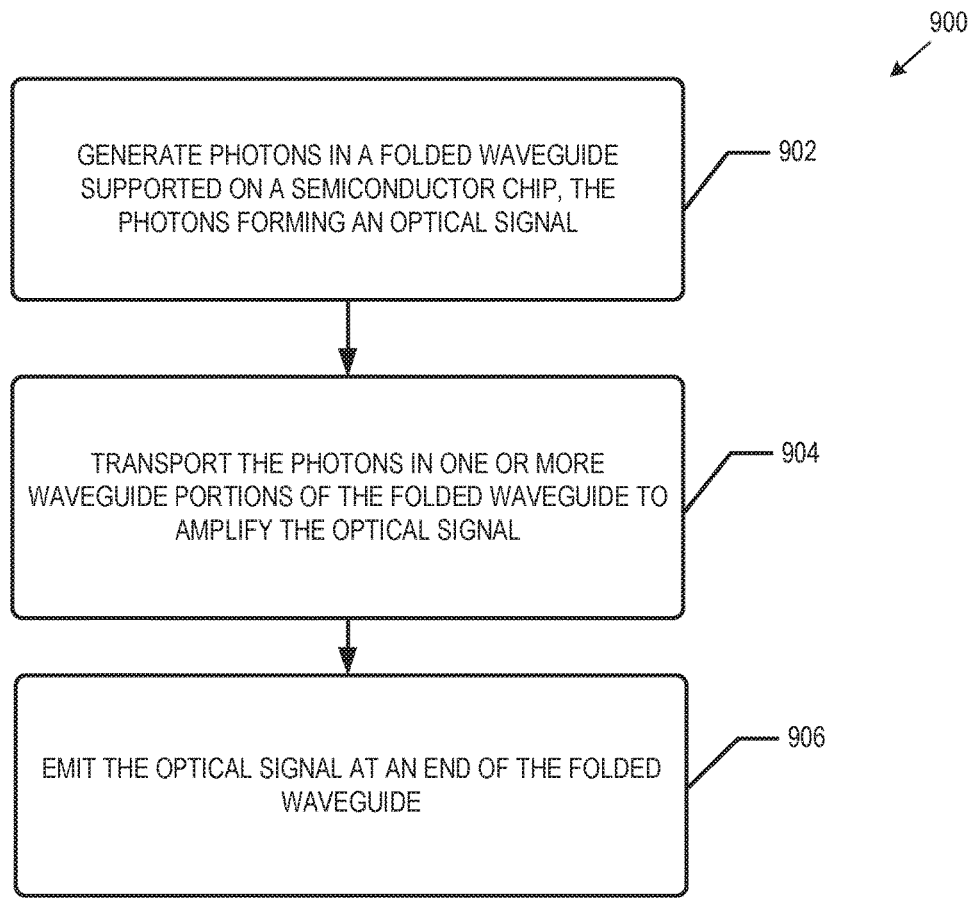
FIG. 9 is a flowchart of a method for generating an optical signal using a semiconductor laser with a folded waveguide, according to some example embodiments.

FIG. 9 is a flowchart of a method for generating an optical signal using a semiconductor laser with a folded waveguide, according to some example embodiments. Referring to FIG. 9, the method 900 includes operations 902, 904, and 906. In operation 902, photons can be generated in a folded waveguide supported on a semiconductor chip, the photons forming an optical signal. For example and in reference to FIG. 4C and FIG. 4D, and optical signal can be generated when a driving current is applied to the waveguide via connectors or other conductive wires or elements coupled to the electrode of the semiconductor laser.

In operation 904, the photons can be transported in one or more curved waveguide portions of the folded waveguide to amplify the optical signal within the folded waveguide. The one or more curved waveguide portions can include a mirror, such as an etched or cleaved facet mirror. For example, the generated optical signal can be amplified as the optical signal photons are transported within the folded waveguide. The folded waveguide can include multiple Y-branch waveguide sections, which can include mirrors.

In operation 906, the optical signal can be emitted from a facet at an end of the folded waveguide, with the end of the folded waveguide being positioned at an edge of the chip. For example, the amplified optical signal can be emitted by an etched facet (e.g., 237 at the end of the waveguide 450). The techniques described in reference to FIG. 9 can apply to any or all of the embodiments described herein.

Mirrors (e.g., 237 and 238) are illustrated in various embodiments herein (e.g., in the lasers depicted in FIGS. 2A-4C, for example). Even though single lasers are illustrated in the attached Figures, the disclosure is not limited in this regard and multiple lasers can be combined, by coupling corresponding waveguide edges (e.g., be coupling facet edges of different lasers). Within a single laser, the direction of the light signal propagating within the waveguide of such laser can be controlled by using different reflection coating at the mirror edges. For example, if mirror 237 is coated with highly-reflective coating and mirror 238 is coated with anti-reflection coating, then light will propagate in the direction towards mirror 238 (and will be output from mirror 238). In this regard, in instances when no reflective coating is used at the mirrors 237 and 238, light can propagate in both directions (and can be output at both mirrors). However, when light directivity is essential, such directivity can be achieved by using different reflection coatings at the mirror edges of the lasers.

Although a few embodiments have been described with reference to specific figures, it will be evident that various modifications and changes may be made to these embodiments without departing from the broader scope of the present disclosure, and any arrangement calculated to achieve the same purpose may be substituted for the specific embodiments shown. Accordingly, the specification and drawings are to be regarded in an illustrative rather than a restrictive sense. The accompanying drawings that form a part hereof show, by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method for generating an optical signal by a semiconductor laser, the method comprising:
    a first distributed feedback (DFB) laser generating a continuous wave light signal via a constant bias current,
    a folded waveguide guiding the light signal in a substantially straight waveguide portion, via a curved connecting waveguide structure and through a second substantially straight waveguide portion for injection into a second DFB laser;

the second DFB laser forming an injection locked optical signal with direct modulation; and the folded waveguide emitting the optical signal at an edge of the semiconductor substrate.

* * * * *